(12) United States Patent  (10) Patent No.: US 8,004,309 B2
Norman  (45) Date of Patent: Aug. 23, 2011

(54) PROGRAMMABLE LOGIC DEVICE STRUCTURE USING THIRD DIMENSIONAL MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 7 days.

(21) Appl. No.: 12/657,684

(22) Filed: Jan. 25, 2010

(65) Prior Publication Data

US 2010/0134138 A1 Jun. 3, 2010

Related U.S. Application Data

(62) Division of application No. 12/008,077, filed on Jan. 7, 2008, now Pat. No. 7,652,501.

(51) Int. Cl.
*H03K 19/173* (2006.01)
*H03K 19/177* (2006.01)
(52) U.S. Cl. .......................... 326/40; 326/38
(58) Field of Classification Search ............ 326/37–41, 326/47, 101
See application file for complete search history.

(56) References Cited

U.S. PATENT DOCUMENTS

| 7,307,445 B2* | 12/2007 | Liang et al. | 326/26 |
| 7,382,153 B2* | 6/2008 | Ou-yang et al. | 326/30 |
| 2009/0051390 A1* | 2/2009 | Heragu et al. | 326/83 |

* cited by examiner

*Primary Examiner* — Rexford N Barnie
*Assistant Examiner* — Thienvu V Tran

(57) ABSTRACT

A Programmable Logic Device (PLD) structure using third dimensional memory is disclosed. The PLD structure includes a switch configured to couple a polarity of a signal (e.g., an input signal applied to an input) to a routing line and a non-volatile register configured to control the switch. The non-volatile register may include a non-volatile memory element, such as a third dimension memory element. The non-volatile memory element may be a two-terminal memory element that retains stored data in the absence of power and stores data as a plurality of conductivity profiles that can be non-destructively sensed by applying a read voltage across the two terminals. New data can be written to the two-terminal memory element by applying a write voltage across the two terminals. Logic and other active circuitry can be positioned in a substrate and the non-volatile memory element can be positioned on top of the substrate.

20 Claims, 7 Drawing Sheets

PROGRAMMABLE LOGIC DEVICE STRUCTURE USING THIRD DIMENSIONAL MEMORY

CROSS-REFERENCE TO RELATED APPLICATIONS

This application is related to U.S. patent application Ser. No. 11/095,026, filed Mar. 30, 2005 and entitled "Memory Using Mixed Valence Conductive Oxides," Published U.S. Application No. US 2006/0171200, which is herein incorporated by reference for all purposes. This application also incorporates by reference U.S. patent application Ser. No. 12/005,685, filed Dec. 28, 2007 and entitled "Non-Volatile Processor Register", Published U.S. Application No. US 2009/0172350.

FIELD OF THE INVENTION

Various embodiments of the invention relate generally to semiconductors and memory technology. More specifically, a programmable logic device structure using third dimensional memory is described.

BACKGROUND

A Programmable Logic Device ("PLD") was developed as a flexible tool to help designers generate specific logic functions from standard parts. Using PLDs, a system designer has the ability to build address decoders and gating logic for system boards, known as the "glue" logic within a system. This type of design can be implemented by assigning connection lists for the logic structure. In a conventional PLD, the input generates a true term and a compliment term, allowing a designer to select a polarity (i.e., a state of the input signal) for the logic structure. The polarities of the inputs are then presented to a connection array, allowing a designer to select the connection inputs to logic gates such as AND, OR, and AND OR Inputs ("AOI") (e.g., multi-input AND gates). By selecting the connections, a designer would have the ability to specify the logic function. Special software allows designers to quickly write and set the desired connections. This software allows designers to assign names to pins and then write Boolean equations for how the terms are to be connected. Once the Input/Output ("IO") names and Boolean equations are defined, the data are usually passed through a special compiler that builds a connect map for the device. The connect map acts as a database for describing how voltage is applied to give the desired connections as specified in the equations. To program a device, a blank part is put in a special programmer. The programmer applies voltages to the part according to the compiled connect map, resulting in a uniquely programmed device.

In conventional PLD structures, there are two common approaches of selecting the desired inputs: fuse blowing and using anti-fuse technology. The first approach, fuse blowing technology, uses a grid of connection lines that are connected to the inputs through fuses. All of the lines are initially connected to all of the inputs through fuses. When the programming procedure is complete, the fuses not desired for connection are removed, leaving only the desired connections. In programming the device, the programmer and PLD device work together to apply high voltages to the undesired locations. The metal fuse of the undesired connections is blown by the high voltage, opening the connection and removing it from the logic path. This approach typically requires high voltage circuitry and a substantial overhead in the overall design. In the second approach, anti-fuse technology uses anti-fuses made from amorphous material. Initially, the amorphous material is sandwiched between two metal lines. The amorphous material as deposited is non-conductive, isolating the lines from each other. Then, when a specific voltage level is applied to the amorphous material, the characteristics of the material change from non-conducting to conducting. This allows the metal lines at the point of applied voltage to be shorted, creating the desired connections. The formation of a connection using amorphous material is the opposite of fuse technology. In particular, the application of the specific voltage level creates a desired connection instead of removing an undesired connection, thus the name "anti-fuse."

Both fuse blowing and anti-fuse technologies have limitations. The fuse and anti-fuse material cannot be tested. Once the part is programmed (e.g., once the fuse is blown or the anti-fuse connection is created), it is permanent and cannot be reset for customer use. This might result in a relatively high dead-on-arrival ("DOA") rate for parts. This problem has been addressed by special test circuitry that allows for partial testing of the logic. However, this adds logic that does not add to the functional operation of the part, resulting in an increased die size (and price) without increased function. Since neither technology is reprogrammable, the parts do not allow for dynamic reprogramming. Once the part is programmed, it is permanent and any changes would require using a new part. Further, these technologies use non-standard CMOS processes and cannot be incorporated into standard CMOS designs.

There are continuing efforts to improve PLD devices.

BRIEF DESCRIPTION OF THE DRAWINGS

The present invention will be readily understood by the following detailed description in conjunction with the accompanying drawings, and like reference numerals designate like structural elements. Although the Drawings depict various examples of the invention, the invention is not limited by the depicted examples. Furthermore, the depictions are not necessarily to scale.

DETAILED DESCRIPTION

Figure 1A:
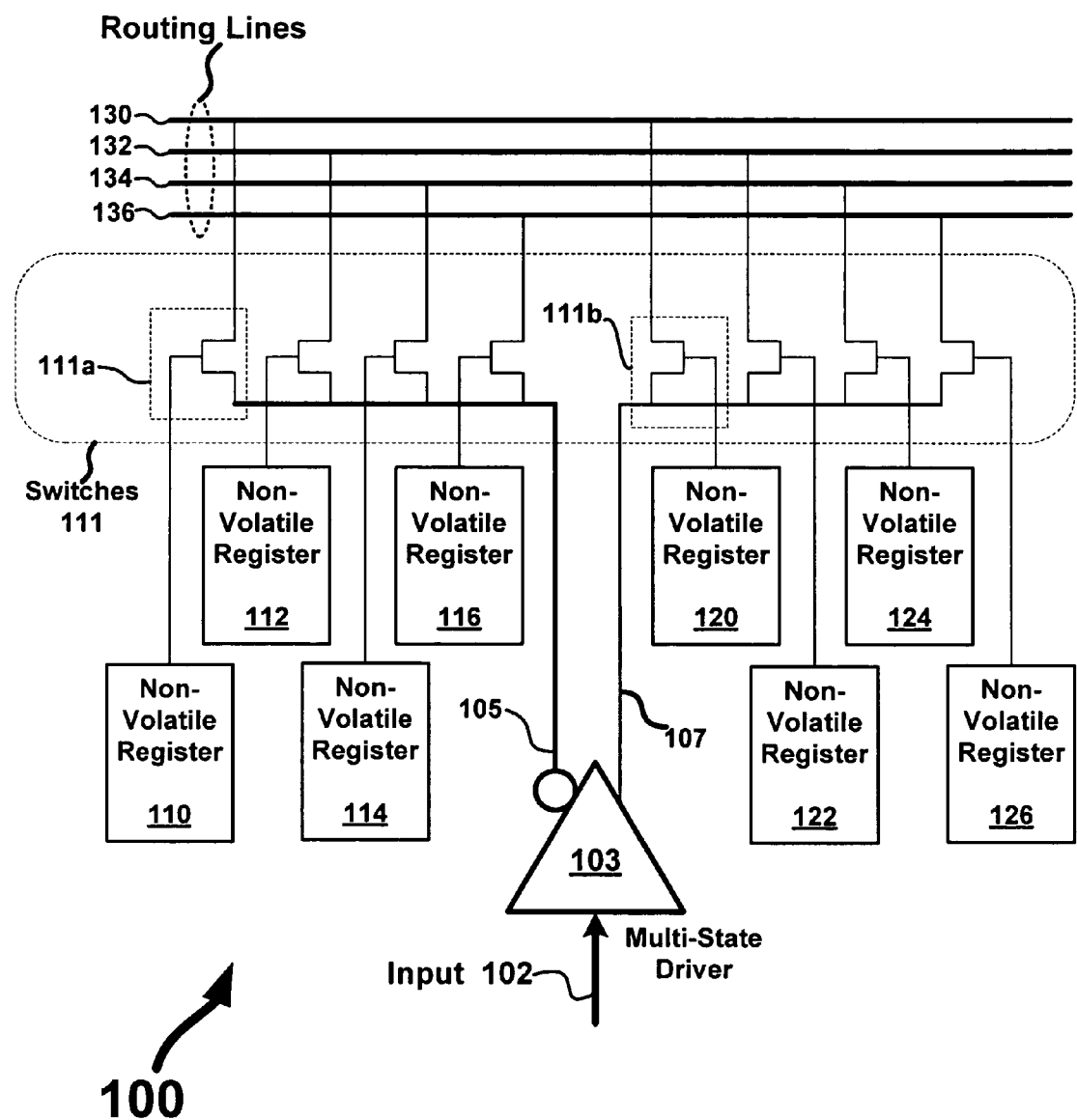
FIG. 1A illustrates an exemplary Programmable Logic Device ("PLD") structure, according to one or more embodiments of the invention.

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable a Programmable Logic Device ("PLD") structure using third dimensional memory. U.S. patent application Ser. No. 11/095,026, filed Mar. 30, 2005, and titled "Memory Using Mixed Valence Conductive Oxides", Published U.S. Application No. US 2006/0171200, hereby incorporated by reference in its entirety and for all purposes, describes two-terminal memory cells that can be arranged in a cross-point array. The application describes a two-terminal memory element that changes conductivity when exposed to an appropriate voltage drop across the two terminals. The memory element includes an electrolytic tunnel barrier and a mixed valence conductive oxide. The voltage drop across the electrolytic tunnel barrier causes an electrical field within the mixed valence conductive oxide that is strong enough to move oxygen ions out of the mixed valence conductive oxides and into the electrolytic tunnel barrier. Oxygen depletion causes the mixed valence conductive oxide to change its valence, which causes a change in conductivity. Both the electrolytic tunnel barrier and the mixed valence conductive oxide do not need to operate in a silicon substrate, and, therefore, can be fabricated above circuitry being used for other purposes (such as selection circuitry).

The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½–$V_{W1}$ to the y-direction line) it switches to a low resistive state. When a second write voltage $V_{W2}$ is applied across the memory element, (typically by applying ½ $V_{W2}$ to the x-direction line and ½–$V_{W2}$ to the y-direction line) it switches to a high resistive state. Typically, memory elements using electrolytic tunnel barriers and mixed valence conductive oxides require $V_{W1}$ to be opposite in polarity from $V_{W2}$.

In at least one embodiment, a non-volatile register implemented with non-volatile third dimensional memory array elements may be used to control the selection of inputs for connection (i.e., routing function) in a PLD structure. As used herein, the term "PLD" refers, at least in one embodiment, to Programmable Array Logic ("PAL"), which may be used to implement logic functions such as counters and decoders. In some examples, the term "PLD" can also describe structures and/or functions that are equivalent to gate arrays, such as field programmable gate arrays ("FPGAs"). The non-volatile register may be programmed by applying a voltage difference across the third dimensional memory element. In some examples, a PLD structure may use plus and minus voltages (e.g., +3 Volts and −3 Volts) derived from a pin supplying an input voltage the PLD structure. First, this allows the PLD structure to be reprogrammable since the non-volatile register may be reprogrammed by applying the voltage difference to an alternate set of non-volatile registers, thus changing the routing function of the PLD. Thus, this routing for a PLD structure may be dynamically set in accordance with various embodiments of the invention, rather than having a one-time programming methodology.

Second, a PLD structure need not use high voltage charge pumps, which reduces circuitry costs, according to various embodiments of the invention. Third, reliability can be improved since high voltage circuits and capacitors might have a relatively higher failure rate than low voltage logic. Further, the non-volatile register structure (or a portion thereof) may be placed above (or at a different layer) a logic structure. In some examples, the logic structure may be formed using a CMOS (complementary metal-oxide-semiconductor) process, such as a standard CMOS process, thereby enabling the non-volatile register structures (or portions thereof) to be added to, or integrated with, a standard CMOS process. In some examples, a portion of a non-volatile register structure includes one or more memory elements. As used herein, the term "memory element" can refer, at least in one embodiment, to a non-volatile memory cell or cells. As was described above, in one instance, a memory element can be a two-terminal element that changes conductivity when exposed to an appropriate voltage drop across the two-terminals. The memory element can include an electrolytic tunnel barrier and a mixed valence conductive oxide. Multiple layers of these memory element structures may be stacked to achieve relatively high density. Since this PLD structure may be added to CMOS-based designs, designers have the ability to add programmable areas to their designs that allow customers to alter certain functions, such as address usage space. This capability allows PLD structures that use non-volatile memory elements, according to the various embodiments of the invention, to be used across a wider range of applications. Further, non-volatile registers may be used to control routing function at the logic gate level, at the logic block level, or at the system level.

FIG. 1A illustrates an exemplary Programmable Logic Device ("PLD") structure 100, according to one or more embodiments of the invention. Here, the structure 100 includes input 102, non-volatile registers 110-126, and routing lines 130-136. While FIG. 1A depicts one input 102, in other examples, there may be more than one input coupled to routing lines 130-136. Additional inputs may be added by repeating the structure used for input 102. Further, PLD structure 100 may be designed to include more or fewer routing lines than are shown in FIG. 1A, with corresponding more or fewer non-volatile registers and switches. As used herein, the term "switch" may refer to an electronic switch, a transistor, an n-channel or p-channel device with appropriate pull-down and pull-up resistors, a pass gate, a transmission gate, and any other known electronic switching mechanisms. While FIG. 1A and other figures show a transistor as the switch, other types of switching elements may be used, and, as such, various embodiments are not limited to the switching functions, structures, configurations, or implementations that are represented by the transistors. FIG. 1A also shows that PLD structure 100 can include a multi-state driver 103 configured to generate signals having two or more logic states in response to application of an input signal to input 102, where the two or more logic states can include the logic state of the input signal. As used herein, the term "input" can refer, at least in one embodiment, to either a structure, such as a terminal or a port, or a signal applied to the structure, or both.

The array of non-volatile registers 110-126 may be used to set the routing paths by controlling a corresponding switch 111 coupled to the non-volatile register. In some examples, switch 111 may be an electronic switch. In other examples, switch 111 may be a transistor, as shown in FIG. 1A. By programming one or more of non-volatile registers 110-126, the positive or negative polarity (e.g., the true or complement, respectively) of a signal (e.g., an input signal 102) applied to input 102 may be selectively connected to routing lines 130-136. Routing lines 130-136 may be coupled to various logic gates or logic elements (not shown), thus propagating the selected signal (e.g., the positive or negative polarity of input 102) to the input of a logic gate. As an example, consider that a designer wants to connect the negative polarity of the signal applied to input 102 to routing line 130, non-volatile register 110 can be programmed to control corresponding switch 111a to be "on" (e.g., having a closed connection) and non-volatile register 120 is programmed to control corresponding switch 111b to be "off" (e.g., having an open connection). Thus, routing line 130 is connected to the negative polarity of the signal applied to input 102. In other examples, structure 100 and the above-described elements may be varied and are not limited to the functions, structures, configurations, or implementations provided. Examples of logic elements include logic gates such as AND, OR, AND OR Inputs ("AOI") (e.g., multi-input AND gates), and the like, or any combinational logic based on such logic gates.

Figure 1B:
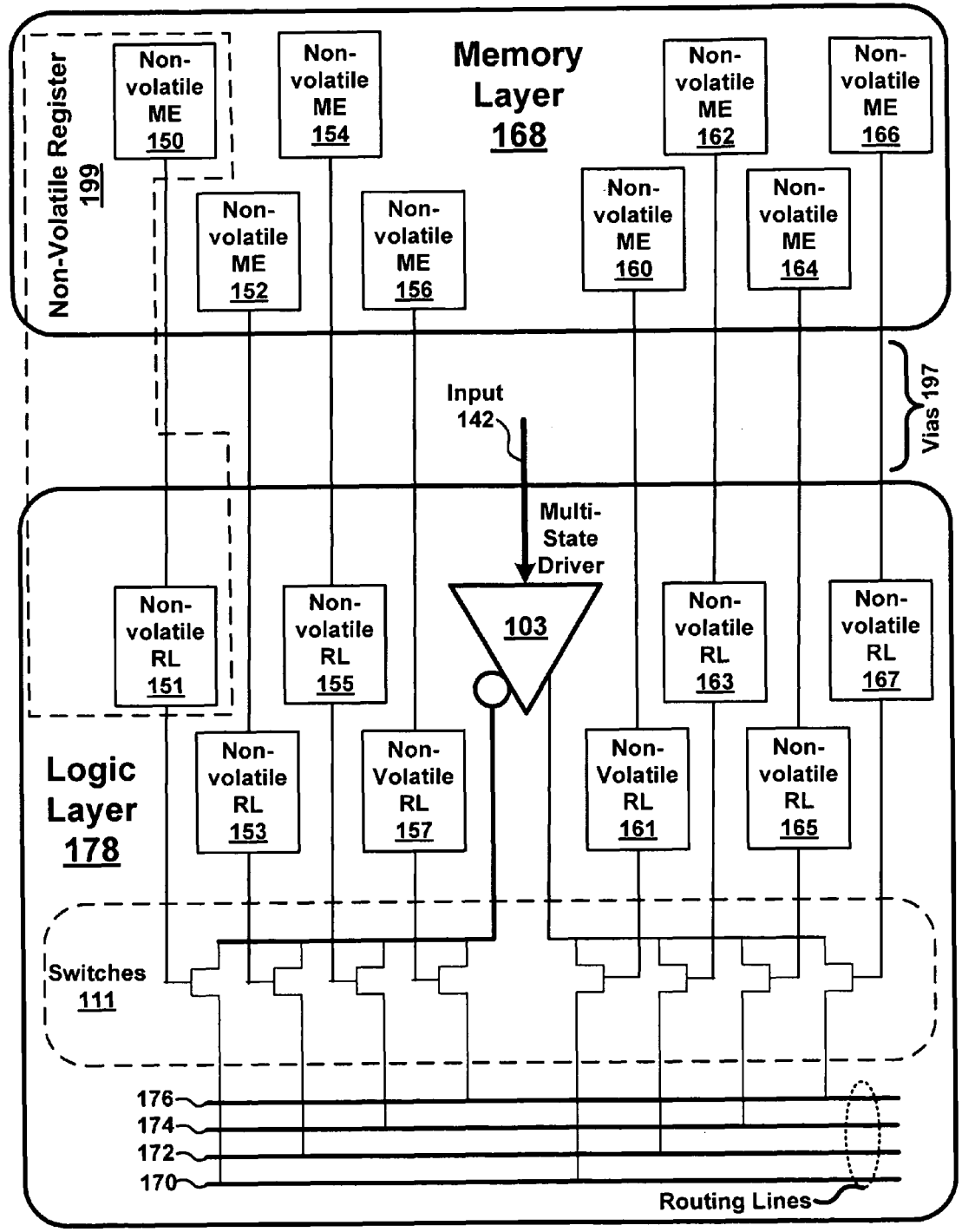
FIG. 1B illustrates an alternative exemplary PLD structure, according to one or more embodiments of the invention.

FIG. 1B illustrates an alternative exemplary PLD structure 140, according to one or more embodiments of the invention. Here, the PLD structure 140 includes input 142 configured to receive an input signal, in some examples, non-volatile memory elements ("MEs") 150-166 in a memory layer 168. Further, PLD structure 140 can include non-volatile register logic ("RL") 151-167 and routing lines 170-176 in logic layer 178. Combination of a non-volatile memory element and register logic can constitute a non-volatile register, according to various embodiments of the invention. For example, non-volatile memory element 150 and non-volatile register logic 151 can constitute a non-volatile register 199. As such, non-volatile memory elements 152-166 can combine with non-volatile register logic 153-167, respectively, to form non-volatile registers (not shown) that are similarly to non-volatile register 199. In one embodiment, non-volatile memory elements 150-166 can be formed in memory layer 168 that can be vertically displaced by one or more memory layers (not shown) from non-volatile register logic 151-167 in logic layer 178. In at least one instance, non-volatile memory elements 150-166 can be coupled by vias 197 to non-volatile register logic 151-167.

While FIG. 1B shows one input 142, in other examples, there may be more than one input coupled to routing lines 170-176. Additional inputs may be added by repeating the structure used for input 142. Further, PLD structure 140 may be designed to include more or fewer routing lines than are shown in FIG. 1B, with corresponding more or fewer non-volatile registers and switches. In a specific embodiment, non-volatile memory elements 150-166 and non-volatile register logic 151-167 are similar in structure and/or function as described in U.S. patent application Ser. No. 12/012,641, filed Feb. 5, 2008 and entitled "Non-Volatile Register." In other examples, PLD structure 140 and the above-described elements may be varied and are not limited to the functions, structures, configurations, or implementations provided.

Figure 2:
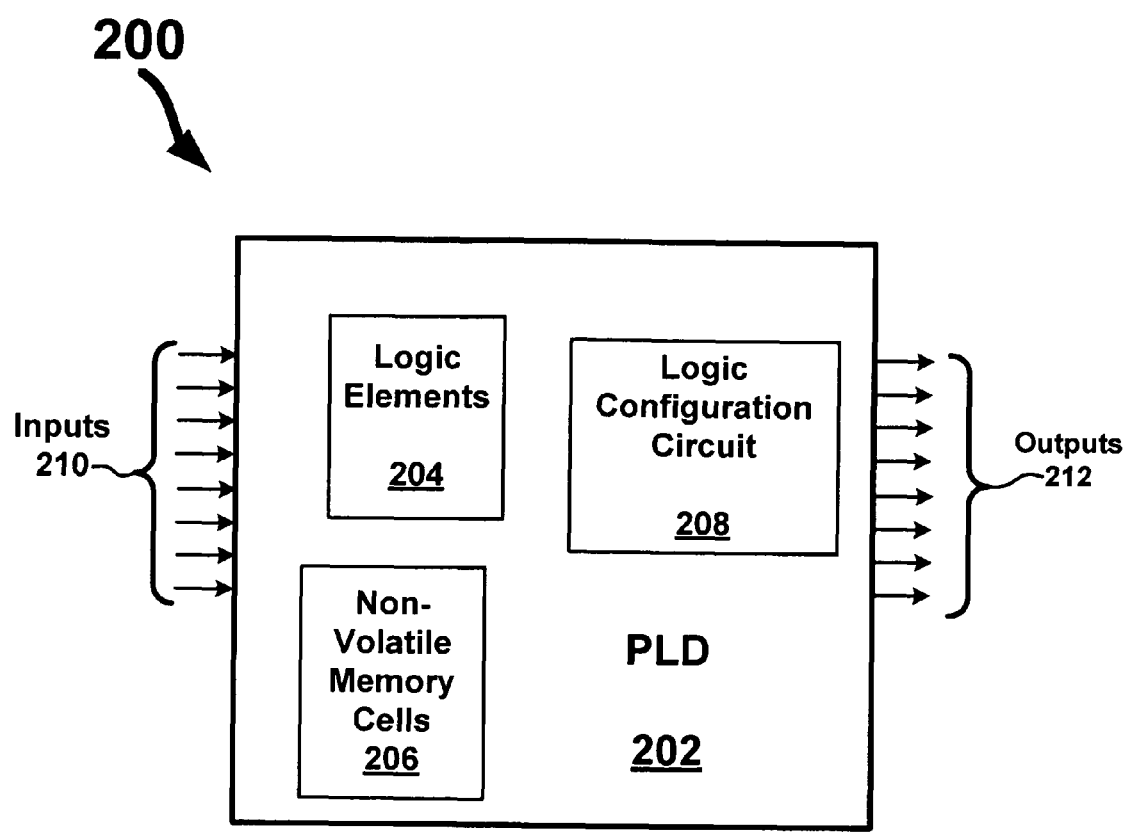
FIG. 2 illustrates another alternative exemplary PLD structure, according to one or more embodiments of the invention.

FIG. 2 illustrates another alternative exemplary PLD structure 200, according to one or more embodiments of the invention. Here, the structure 200 includes PLD 202, logic elements 204, non-volatile memory cells 206, and logic configuration circuit 208. In some examples, logic elements 204 may include single logic gates (e.g., AND gates, OR gates, or inverters, and the like). In other examples, logic elements 204 may include a combination of logic gates. Non-volatile memory cells 206 may be configured to provide routing data. A designer may specify the logic design with Boolean equations or logic tables, from which corresponding routing data may be generated. Logic configuration circuit 208 may be configured to configure a subset of logic elements 204 to generate one or more outputs 212 for PLD 202. In some examples, logic configuration circuit 208 may generate an output 212 as a function of a logical (e.g., Boolean) expression in response to a subset of the routing data from non-volatile memory cells 206. The subset of the routing data can be determined in response to a unique set of data applied to inputs 210. For example, an address can be applied to inputs 210 as address bit signals. In a specific embodiment, logic configuration circuit 208 can include non-volatile register logic and/or switches, and the like.

In other examples, logic configuration circuit 208 may be configured to configure a subset of logic elements 204 substantially at power-up. Since non-volatile memory cells 206 retain their contents when power is removed from (i.e., not applied to) memory cells 206, the routing data provided by non-volatile memory cells 206 may be accessed quickly (i.e., instantaneously or substantially instantaneously) upon power-up. In other examples, structure 200 and the above-described elements may be varied and are not limited to the functions, structures, configurations, or implementations provided.

Figure 3:
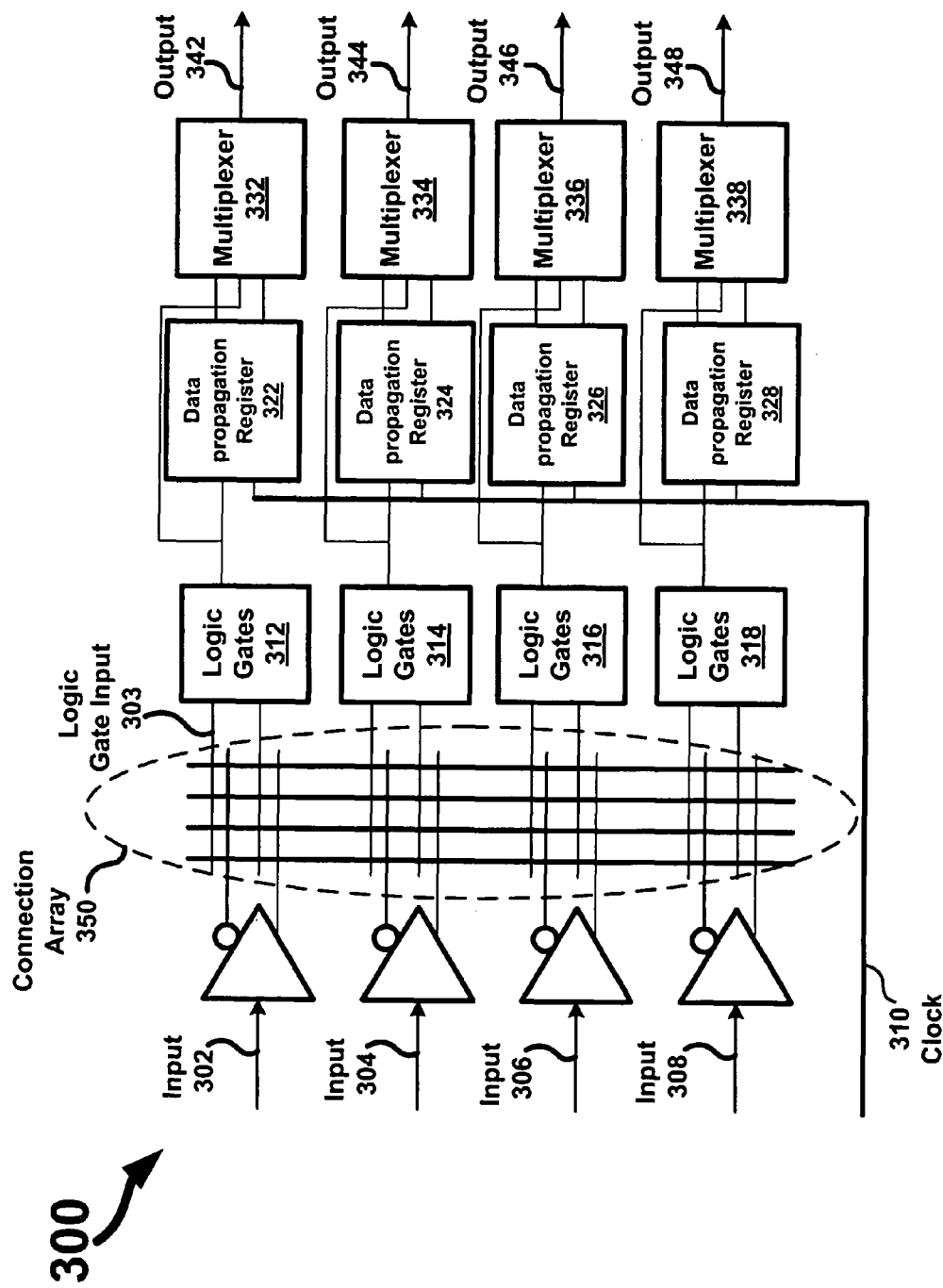
FIG. 3 illustrates an exemplary logic block, according to one or more embodiments of the invention.

FIG. 3 illustrates an exemplary logic block 300, according to one or more embodiments of the invention. Here, the logic block 300 includes inputs 302-308, clock 310, logic gates 312-318, data propagation registers 322-328, multiplexers 332-338, outputs 342-348, and connection array 350. Logic block 300 may be designed to include more or fewer inputs than are shown in FIG. 3. Further, logic block 300 may be designed to include more or fewer outputs than are shown in FIG. 3, with corresponding more or fewer logic gates, registers, and multiplexers. Connection array 350 is simplified in FIG. 3 to avoid unnecessarily complicating FIG. 3. The grid pattern representing connection array 350 is shown and described in connection with FIG. 1A. In a specific embodiment, connection array 350 can include non-volatile registers and switches, as shown in FIGS. 1A and 1B. In this example, connection array 350 has eight routing lines since the four logic gates 312-318 each have two inputs, such as logic gate input 303. There can be one routing line for each input to each logic gate. Further, the positive and negative polarities from each of the inputs 302-308 are coupled to each of the eight routing lines, with a non-volatile register controlling the connection for each polarity.

In this example, after the non-volatile registers (not shown) of connection array 350 have been programmed and the inputs to logic gates 312-318 are selected (e.g., signals having a logical state of one is applied to inputs 302-308), logic gates 312-318 may generate outputs from their logic functions. These outputs are registered by clock 310 in data propagation registers 322-328. Data propagation registers 322-328 may be used for logic involving state machines or synchronous logic, whereby data propagation registers 322-328 can store data propagation register data (or datum). The inputs to multiplexers 332-338 are the direct outputs of logic gates 312-

318, the true output signals of data propagation registers 322-328 and the complement output signals of data propagation registers 322-328. By having the ability to select between these inputs to multiplexers 332-338 for outputs 342-348, a designer may build complex logic functions such as state machines and counters. In other examples, logic block 300 and the above-described elements may be varied and are not limited to the functions, structures, configurations, or implementations provided.

Figure 4:
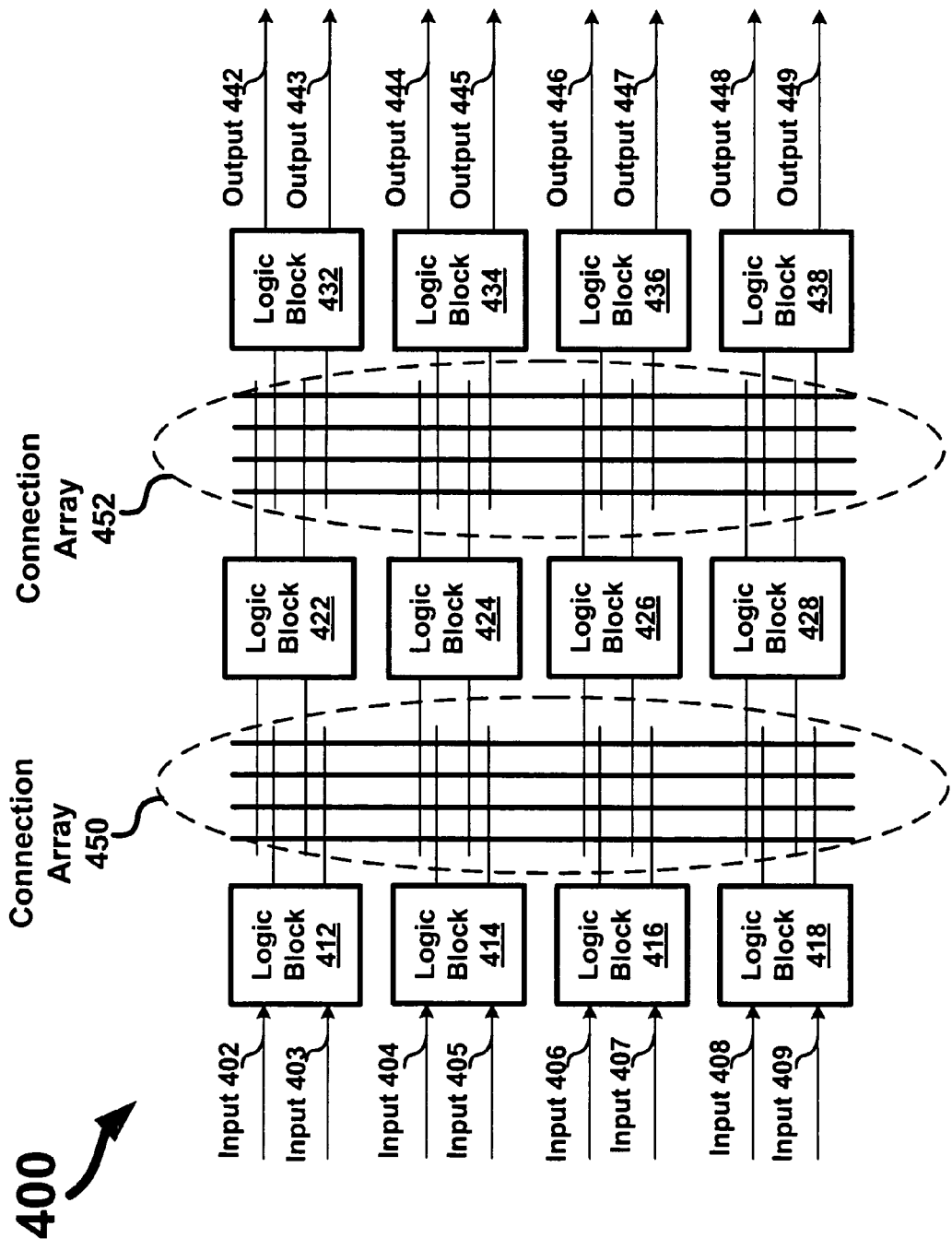
FIG. 4 illustrates an exemplary logic block array, according to one or more embodiments of the invention.

FIG. 4 illustrates an exemplary logic block array 400, according to one or more embodiments of the invention. The technique as described in connection with FIG. 3 may be expanded to include several logic blocks coupled together through connection arrays. Here, the logic block array 400 includes inputs 402-409, logic blocks 412-438, outputs 442-449, and connection arrays 450-452. Logic block array 400 may be designed to include more or fewer inputs than are shown in FIG. 4. Further, logic block array 400 may be designed to include more or fewer outputs than are shown in FIG. 4. Still further, logic block array 400 may be designed to include more or fewer logic blocks than are shown in FIG. 4. Connection arrays 450-452 are simplified in FIG. 4 to avoid unnecessarily complicating FIG. 4. The grid pattern representing connection arrays 450-452 is shown and described in connection with FIG. 1A. In this example, connection array 450 has eight routing lines since the four logic blocks 422-428 have two inputs each. There is one routing line for each input to each of logic blocks 422-428. Further, the positive and negative polarities from each of the outputs of logic blocks 412-418 are coupled to each of the eight routing lines, with a non-volatile register controlling the connection for each polarity. Using this configuration, logic blocks 422-428 may be configured to have any combination of outputs from logic blocks 412-418. Connection array 452 also has eight routing lines since the four logic blocks 432-438 have two inputs each. There is one routing line for each input to each of logic blocks 432-438. Further, the positive and negative polarities from each of the outputs of logic blocks 422-428 are coupled to each of the eight routing lines, with a non-volatile register controlling the connection for each polarity. Using this configuration, logic blocks 432-438 may be configured to have any combination of outputs from logic blocks 422-428. In other examples, logic block array 400 and the above-described elements may be varied and are not limited to the functions, structures, configurations, or implementations provided.

Figure 5:
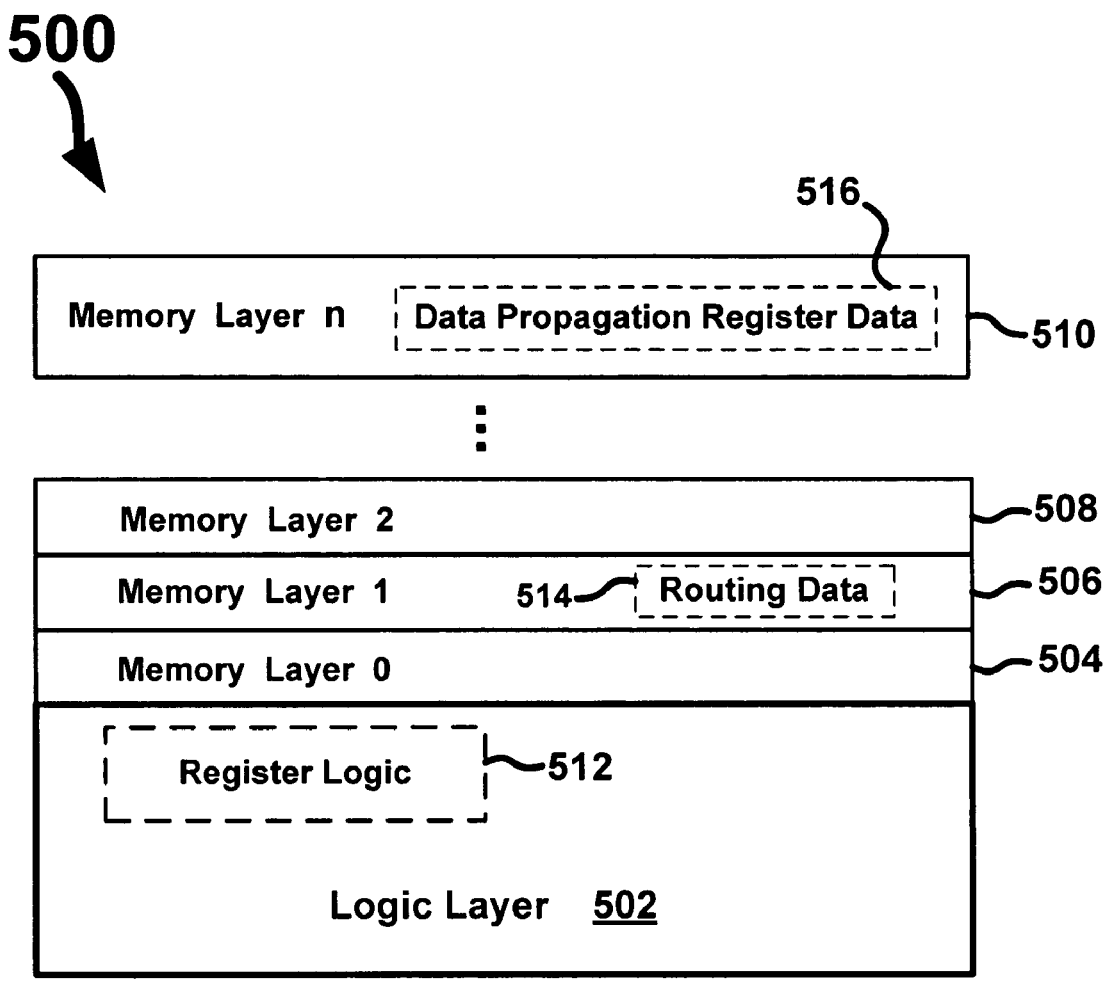
FIG. 5 illustrates an exemplary cross-sectional view of a vertically configured non-volatile third-dimensional memory array, according to one or more embodiments of the invention.

FIG. 5 illustrates an exemplary cross-sectional view of a vertically configured non-volatile third-dimensional memory array 500, according to one or more embodiments of the invention. In some examples, memory array 500 includes logic layer 502, which may be positioned below a vertical configuration of one, two, three, or multiple (i.e., "n") memory array layers 504-510. Each of memory array layers 504-510 may be used for implementing different aspects of a non-volatile register (e.g., non-volatile registers 110-126 (FIG. 1A), and others). For example, a base layer of memory array 500 (e.g., memory array layer 502) may be used to implement register logic 512 and other active circuitry for the non-volatile register, while memory array layers 504-510 may be used to implement the memory element for the non-volatile register. In as specific embodiment, register logic 512 may include a comparator for reading data from the third dimension memory (i.e., memory elements) and switches for switching the polarity of voltages (i.e., access signals) in a write operation, as well applying read voltages in a read operation. Register logic 512 may include a sense unit (e.g., sense amps) for sensing data stored in the non-volatile register(s) during a read operation. The logic layer 502 may be formed in a substrate, such as a silicon (Si) wafer, for example. The memory array layers 504-510 can be fabricated over the substrate and therefore over the logic layer 502 and register logic 512.

In other examples, the number of memory array layers 504-510 may be varied to include more, fewer, or different layers than those shown and described. In one embodiment, routing memory elements 514 can be configured to store routing data for non-volatile registers can be formed in any memory layer, such as memory layer ("1") 506. In at least one embodiment, data propagation memory elements 516 can be configured to store data propagation register data for logic blocks that, for example, include data propagation registers 322-328 of FIG. 3. Data propagation memory elements 516 can be formed in any memory layer, such as memory layer ("n") 510.

As an example, register logic 512 for a non-volatile register may be formed in memory array layer 502. Further, a memory element for the non-volatile register, comprising a first end and a second end, may be formed in memory array layer 504. Register logic 512, configured to be disposed below the memory element, may be connected to the first and second ends of the memory element (e.g., the two terminals of a two-terminal memory element) to provide a voltage difference to the two ends (e.g., a write voltage), thus programming the non-volatile register. Similarly, a read voltage applies across the two ends may be used to read stored data in the non-volatile register. In other examples, more, fewer, or different layers than those shown may be used. In still other examples, system 500 and the above-described elements may be varied and are not limited to the functions, structures, configurations, or implementations provided.

Figure 6:
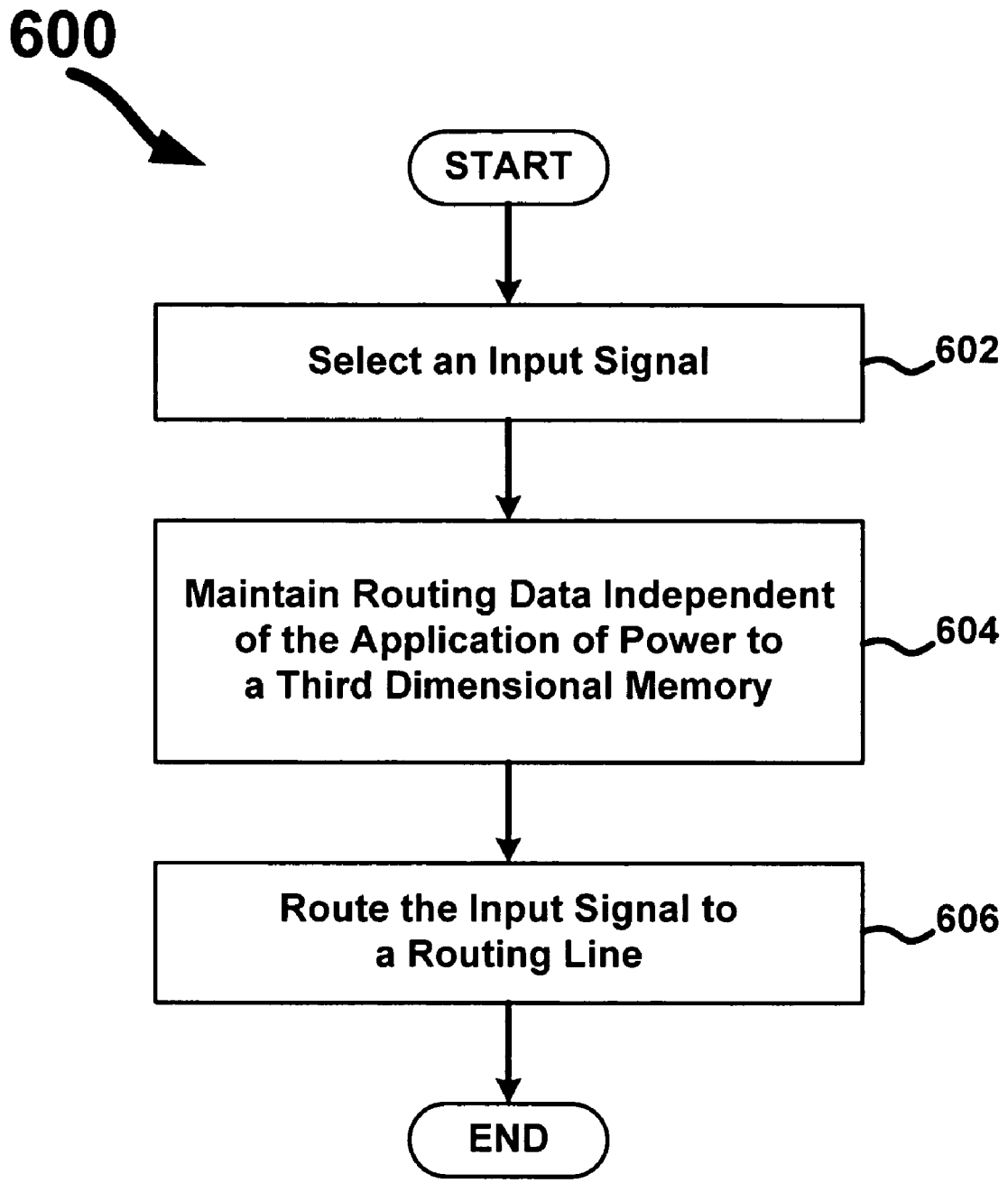
FIG. 6 illustrates an exemplary process for using a PLD, according to one or more embodiments of the invention.

FIG. 6 illustrates an exemplary process 600 for using a PLD, according to one or more embodiments of the invention. Here, process 600 starts by selecting an input signal (at a stage 602). In some examples, the input signal may be selected from a plurality of inputs. Routing data are maintained independent of the application of power to a third dimensional memory (at a stage 604). Since routing data are maintained independent of the application of power, the routing data are retained even when power is removed from (i.e., not applied to) the third dimensional memory. Thus, the routing data may be accessed quickly upon power-up. In at least one instance, register logic can generate access signals (e.g., write and/or read voltages to access, for example, third dimension memory cells) for vertical transmission among memory layers and a logic layer. Process 600 continues with routing the input signal to a routing line (at a stage 606). In some examples, a first signal having the positive polarity of the input signal is routed to the routing line. In other examples, a second signal having the negative polarity of the input signal is routed to the routing line. The routing line may connect the input signal to the input of a logic gate or a logic block. Process 600 may be further used to test routing paths by altering the routing data dynamically during test mode (e.g., prior to delivery to a customer). During testing, test patterns can be generated and applied to the inputs, as input signals, to modify the routing data by reprogramming non-volatile registers configured to control the switches. This, in turn, may dynamically alter the routing paths and the routing behavior. For example, consider testing a first routing path extending from an input at which the input signal is applied (e.g., a test stimulus or input) via a routing line to at least one logic gate. The logic gate will generate an output that can be verified against expected results. If the output is as expected, then the first routing path is deemed to have passed. Further, another routing path that extends from the input to another logic gate can be tested by again modifying the routing data. A subsequent affirmed output generated in association with the other logic gate assures proper operation of the other routing path. After tests are completed, the routing data can be cleared (e.g., erased) prior to shipping the PLD to a customer. In other examples, the above-described process may be varied and is not limited to the processes or sub-processes described above.

The foregoing examples have been described in some detail for purposes of clarity of understanding, but are not limited to the details provided. There are many alternative ways and techniques for implementation. The disclosed examples are illustrative and not restrictive.

What is claimed is:

1. A method for programming a Programmable Logic Device (PLD) comprising:
    providing a substrate including a logic layer having active circuitry fabricated on the substrate and at least one layer of third dimensional memory fabricated in contact with and directly above the substrate, the at least one layer of third dimensional memory in electrical communication with the active circuitry;
    selecting an input signal from a plurality of inputs that are electrically coupled with the active circuitry;
    maintaining routing data independent of the application of electrical power to the at least one layer of third dimensional memory by storing the routing data in at least one non-volatile register, each non-volatile register including at least one non-volatile memory element positioned in the at least one layer of third dimensional memory and non-volatile register logic included in the active circuitry and electrically coupled with the at least one non-volatile memory element; and
    routing the input signal to a routing line.

2. The method of claim 1 and further comprising:
    testing a routing path formed from an input at which the input signal is applied via the routing line to at least one logic gate positioned in the active circuitry.

3. The method of claim 2 and further comprising:
    writing different routing data into the at least one layer of third dimensional memory to alter the routing path to form a different routing path; and
    testing the different routing path formed from the input at which the input signal is applied to at least one other logic gate positioned in the active circuitry.

4. The method of claim 2 and further comprising:
    clearing the different routing data.

5. The method of claim 2, wherein the writing and the testing occur dynamically.

6. The method of claim 1, wherein the at least one non-volatile memory element comprises at least one two-terminal memory element configured in a two-terminal cross-point memory array.

7. The method of claim 6, wherein each two-terminal memory element is operative to store data as a plurality of conductivity profiles and is configured to retain stored data in the absence of electrical power, stored data is non-destructively determined by applying a read voltage across the two-terminal memory element, and new data is written by applying a write voltage across the two-terminal memory element.

8. The method of claim 6, wherein each two-terminal memory element includes an electrolytic tunnel barrier and a mixed valence conductive oxide.

9. The method of claim 1, wherein the at least one layer of third dimensional memory comprises a plurality of vertically stacked memory layers.

10. The method of claim 1, wherein the at least one layer of third dimensional memory and the active circuitry are configured to implement a programmable array logic (PAL).

11. The method of claim 1, wherein the at least one layer of third dimensional memory and the active circuitry are configured to implement a gate array.

12. The method of claim 1, wherein the at least one layer of third dimensional memory and the active circuitry are configured to implement a field programmable gate array (FPGA).

13. The method of claim 1, wherein the active circuitry comprises CMOS circuitry.

14. A method for programming a Programmable Logic Device (PLD) comprising:
    providing active circuitry fabricated on a logic layer of a substrate, the logic layer including a plurality of inputs, a plurality of outputs, logic elements, and logic configuration circuitry operative to use routing data to configure the logic elements, the logic elements when configured, are operative to generate at least one output on at least one of the plurality of outputs in response to at least one signal on at least one of the plurality of inputs;
    providing at least one layer of third dimensional memory fabricated in contact with and directly above the substrate, the at least one layer of third dimensional memory including a plurality of non-volatile memory cells operative to store the routing data, the plurality of non-volatile memory cells are in electrical communication with the active circuitry;
    selecting the at least one signal from the plurality of inputs that are electrically coupled with the active circuitry;
    maintaining the routing data independent of the application of electrical power to the plurality of non-volatile memory cells; and
    routing the at least one signal to at least one of the plurality of output signals.

15. The method of claim 14, wherein each non-volatile memory cell is configured in a two-terminal cross-point memory array.

16. The method of claim 15, wherein each non-volatile memory cell includes a two-terminal memory element operative to store data as a plurality of conductivity profiles and is configured to retain stored data in the absence of electrical power, stored data is non-destructively determined by applying a read voltage across the two-terminal memory element, and new data is written by applying a write voltage across the two-terminal memory element.

17. The method of claim 16, wherein each two-terminal memory element includes an electrolytic tunnel barrier and a mixed valence conductive oxide.

18. The method of claim 14, wherein the at least one layer of third dimensional memory comprises a plurality of vertically stacked memory layers.

19. The method of claim 14, wherein the active circuitry comprises CMOS circuitry.

20. The method of claim 14 and further comprising:
    testing a routing path formed from one of the plurality of inputs at which the at least one signal is applied via a routing line to at least one logic gate positioned in the logic elements.

* * * * *